United States Patent [19]

Takasugi

[11] Patent Number: 5,265,049
[45] Date of Patent: Nov. 23, 1993

[54] SERIAL ACCESS MEMORY CAPABLE OF READING DATA SERIALLY AT A SPEED DOUBLE THE WRITING SPEED

[75] Inventor: Atsushi Takasugi, Tokyo, Japan

[73] Assignee: Oki Electric Industry Co., Ltd., Tokyo, Japan

[21] Appl. No.: 868,795

[22] Filed: Apr. 16, 1992

[30] Foreign Application Priority Data

Apr. 25, 1991 [JP] Japan .................................. 3-095897

[51] Int. Cl.$^5$ .............................................. G11C 7/00
[52] U.S. Cl. .............................. 365/189.01; 365/221; 365/233
[58] Field of Search ............... 365/187.01, 219, 220, 365/221, 230.05, 233, 191

[56] References Cited

U.S. PATENT DOCUMENTS

| | | | |
|---|---|---|---|
| 4,710,966 | 12/1987 | Aufiero | 365/220 |
| 4,755,971 | 7/1988 | Jasmer et al. | 365/233 |
| 4,815,036 | 3/1989 | Kyomasu | 365/233 |
| 4,823,321 | 4/1989 | Aoyama | 365/221 X |
| 4,945,518 | 7/1990 | Muramatsu et al. | 365/233 |
| 5,018,110 | 5/1991 | Sugiyama et al. | 365/221 X |

FOREIGN PATENT DOCUMENTS

| | | | |
|---|---|---|---|
| 1-165280 | 6/1989 | Japan. | |
| 0068794 | 3/1990 | Japan | 365/189.01 |

*Primary Examiner*—Eugene R. LaRoche
*Assistant Examiner*—Son Dinh
*Attorney, Agent, or Firm*—Spencer, Frank & Schneider

[57] ABSTRACT

A serial access memory capable of reading out data serially at a speed double the writing speed. The memory is implemented as a semiconductor chip having an edge detecting circuit and a clock doubling circuit for data read-out mounted thereon. The edge detecting circuit detects the positive-going and negative-going edges of a clock fed to the chip from the outside. In response to the output of the edge detecting circuit, the clock doubling circuit generates a read clock having a frequency double the frequency of the external clock. The double-speed clock generated within the chip reduces the cost of the memory.

17 Claims, 7 Drawing Sheets

SERIAL ACCESS MEMORY CAPABLE OF READING DATA SERIALLY AT A SPEED DOUBLE THE WRITING SPEED

BACKGROUND OF THE INVENTION

1. Field of the Invention

The present invention relates to a serial access memory for writing and reading video data or similar data serially thereoutof and, more particularly, to a serial access memory capable of reading data serially thereoutof at a speed twice as high as the writing speed.

2. Description of the Prior Art

New media including satellite broadcasting and high definition television (TV) broadcasting and video apparatuses including video recording/playback apparatuses and large-size TV sets have spread during the recent years. In parallel with the spread of such media and apparatuses, digital video technologies have made long strides to implement high quality images. To make the most of the advantages of this kind of media and apparatuses, various kinds of image display systems have been proposed for displaying a video signal on, for example, a display via a memory. A serial access memory is one of conventional memories optimal for TV images and allows a video signal to be serially written in on a scanning line basis while allowing it to be serially read out and fed at high speed in the horizontal direction of a TV screen. The means for enhancing the image quality by use of such a serial access memory may be implemented as a speed doubling circuit, as disclosed in Japanese Patent Laid-Open Publication No. 165280/1989 by way of example.

A conventional serial access memory, or memory chip, for the above application includes a memory cell for storing video data. An input port receives video data serially from the outside of the memory chip and writes them in the memory cell. A write control circuit controls the input port in synchronism with a write clock also fed from the outside of the chip. An output port reads the video data out of the memory cell and delivers them serially to the outside of the chip. A read control circuit controls the output port in synchronism with a read clock further fed from the outside of the chip. Specifically, the write clock and read clock are generated by a clock generating circuit outside the chip and applied to the write control circuit and the read control circuit, respectively. The speed doubling circuit gives the read clock a frequency double the frequency of the write clock, so that data may be read out at a speed twice as high as the writing speed.

When data are serially applied to the input port from the outside of the chip and the write clock is applied to the write control circuit also from the outside, the write control circuit controls the input port in response to the write clock. Then, the input port reads the data serially in synchronism with the write clock, converts them to, for example, parallel data, and then writes the parallel data in the memory cell. On receiving the read clock from the outside, the read control circuit feeds a control signal to the output port. As a result, the output port reads data out of the memory cell, for example, in parallel in response to the write control signal. The data read out of the memory cell at a speed synchronous to the read clock, e.g., double the writing speed are serially delivered to the outside of the memory chip.

As stated above, it has been customary to double the data read-out speed on the basis of the write clock and read clock both of which are fed from the outside of the memory chip. The problem with this conventional scheme is that the read clock has to be provided with a twice higher frequency than the read clock and, in addition, has to be synchronous to the write clock. Generating such a high-speed read clock outside the memory chip and driving the serial access memory thereby is not practicable without resorting to an advanced drive capability and complicated circuitry. It follows that a display using the conventional serial access memory complicates the circuitry around the memory chip, resulting in a bulky and expensive apparatus.

SUMMARY OF THE INVENTION

It is therefore an object of the present invention to provide a serial access memory capable of doubling the speed within the chip of the memory to thereby simplify the circuitry around the chip, reducing the size and cost of an apparatus operable with such a memory.

In accordance with the present invention, a serial access memory capable of reading out data serially at a speed double the writing speed comprises a storage for sequentially storing data written thereinto and reading the data thereoutof, a data input section connected to the input of the storage for writing data serially inputted from the outside to predetermined address locations of the storage, a write control circuit responsive to an external clock for controlling the write-in of data from the data input section to the storage on the basis of the external clock, a data output section connected to the output of the storage for reading data out of any address locations of the storage and outputting the data in series, an edge detecting circuit for the detecting the positive-going and negative-going edges of the external clock applied to the write control circuit, a clock doubling circuit for generating a read clock having a frequency double the frequency of the external clock in response to the result of edge detection by the edge detecting circuit, and a read control circuit for controlling the data output section in response to the read clock from the clock doubling circuit.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
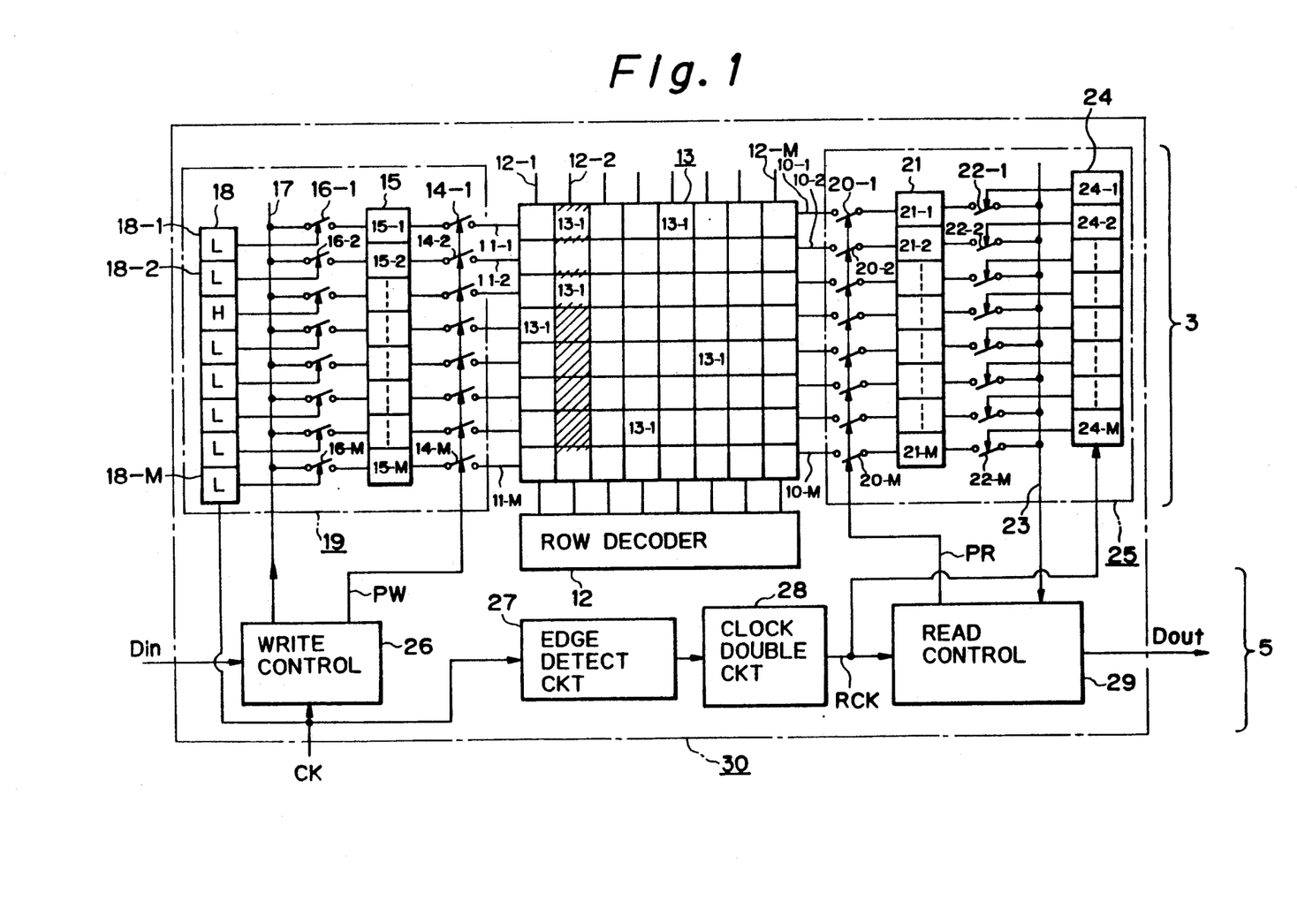
FIG. 1 is a block diagram schematically showing a serial access memory embodying the present invention.

Referring to FIG. 1 of the drawings, a serial access memory embodying the present invention is shown and generally designated by the reference numeral 30. As shown, the memory 30 is implemented as a single chip having a data storing section 3 and a control section 5. The data storing section 3 includes a main storage 13 while the control section 5 includes a write control circuit 26 and a read control circuit 29. The illustrative embodiment writes data serially in the data storing section 3 in response to a single clock CK fed from the outside and reads them serially out of the storing section 3 in response to a read clock RCK whose speed is double the data input speed. The read clock RCK is generated within the chip on the basis of the single clock CK.

Specifically, the data storing section 3 has an input port block 19 and an output port block 25 in addition to the main storage 13. The input port block 19 is connected to the input terminals of the main storage 13 in parallel while the output port block 25 is connected to the output terminals of the main storage 13 in parallel. The input port block 19 is made up of a control register 18 to which the clock CK from the outside is applied, a data transfer line 17 to which data are fed in series, a plurality of first switches 16-1 to 16-M controlled by the control register 18, a data register 15 to which data are fed over the data transfer line 17 via the first switches 16-1 to 16-M, and a plurality of second switches 14-1 to 14-M for selectively connecting the output terminals of the data register 15 to the main storage 13. The control register 18 is a shift register having a plurality of interlocked memory elements 18-1 to 18-M and plays the role of a switch driver for applying a drive signal from one of the memory elements 18-1 to 18-M whose content is in a high level or "H" to associated one of the first switches 16-1 to 16-M. Specifically, on the turn-on of a power source, a reset signal is fed to the control register 18 to change only the memory element 18-1, for example, from a low level or "L" to a high level while maintaining the other memory elements 18-2 to 18-M in a low level. The content "H" of the memory element 18-1 is sequentially shifted to the memory elements 18-2 to 18-M in synchronism with the clock CK, whereby the first switches 16-1 to 16-M associated one-to-one with the memory elements 18-1 to 18-M are turned on one after another. The switches 16-1 to 16-M are implemented by, for example, MOS (Metal Oxide Semiconductor) transistors, and each turns on on receiving the drive signal from associated one of the memory elements 18-1 to 18-M at the gate thereof. The data register 15 has a plurality of memory elements 15-1 to 15-M to which the first switches 16-1 to 16-M are respectively connected. Hence, on the turn-on of one of the switches 16-1 to 16-M, it electrically connects the data transfer line 17 to associated one of the memory elements 15-1 to 15-M of the data register 15. As a result, the serial data transferred over the data transfer line 17 is sequentially written bit by bit to the memory elements 15-1 to 15-M of the data register, or buffer circuit, 15. The second switches 14-1 to 14-M, like the first switches 16-1 to 16-M, are implemented by, for example, MOS transistors and connected one-to-one to the memory elements 15-1 to 15-M. In response to a control signal PW from the write control circuit 26, all the second switches 16-1 to 16-M are turned on at the same time to transfer the data stored in the memory elements 15-1 to 15-M of the data register 15 to the main storage 13 in parallel. In this sense, the second switches 14-1 to 14-M constitute a serial-to-parallel conversion circuit.

The main storage 13 is constituted by a DRAM (Dynamic Random Access Memory) or similar memory device. The data fed from the input port block 19 to the main storage 13 are written to the storage 13 in parallel and stored in the successive columns of the latter. The data are read out of the main storage 13 in parallel. Specifically, the main storage 13 has a plurality of bit lines 11-1 to 11-M to each of which respective one of the data bits from the memory elements 15-1 to 15-M of the data register 15 is applied, word lines 12-1 to 12-M for cell selection, and a row decoder 12 for feeding a drive signal to the word lines 12-1 to 12-M. By the drive signal from the row decoder 12, memory elements 13-1 on the designated column are selected to write or read data. A sense amplifier, not shown, is connected to each of the bit lines 11-1 to 11-M for amplifying signals.

The output port block 25 includes a data register 21 for storing data read out of the main storage 13. A plurality of third switches 20-1 to 20-M selectively connect the output lines 10-1 to 10-M of the main storage 13 to the data register 21, as needed. Data read out of the data register 21 are transferred serially over a data transfer line 23. Fourth switches 22-1 to 22-M selectively connect the data register 21 to the data transfer line 23 under the control of a control register 24. Specifically, the data register 21 is a buffer circuit having a plurality of memory elements 21-1 to 21-M. Bit data read out of the main storage 13 in parallel are written to the respective memory elements 21-1 to 21-M via the third switches 20-1 to 20-M. The third and fourth switches 20-1 to 20-M and 22-1 to 22-M are implemented by MOS transistors like the previously stated switches 14-1 to 14M and 16-1 and 16-M of the input port block 19. In response to a control signal PR from the read control circuit 29, all the switches 20-1 to 20-M are turned on at the same time to bring the output lines 10-1 to 10-M of the main storage 13 into connection with the memory elements 21-1 to 21-M of the data register 21. The switches 22-2 to 22-M are controlled by the control register 24 to sequentially connect the memory elements 21-1 to 21-M of the data register 21 to the data transfer line 23. The control register 24, like the control register 18 of the input port block 19, serves as a switch driver having a plurality of interlocked memory elements 24-1 to 24-M and drives one of the switches 22-1 to 22-M at a time by "H" stored in associated one of the memory elements 24-1 to 24-M. Specifically, on the turn-on of the power source, a reset signal is fed to the control register 24 to change the logical level of only the memory element 24-1, for example, from "L" to "H". This "H" level is sequentially shifted through the other memory elements 24-2 to 24-M in synchronism with the read clock RCK from the control section 5, thereby turning on the switches 22-1 to 22-M one after another.

The control section 5 has a edge detecting circuit 27 and a clock doubling circuit 28 in addition to the write control circuit 26 and read control circuit 29. As the write control circuit 26 receives serial input data Din and the clock CK from external circuitry, it drives the data transfer line 17 to transfer the input data serially to the input port block 19. Also, the write control circuit 26 generates the previously mentioned control signal PW in response to the clock CK and feeds it to the switches 14-1 to 14-M. Specifically, the write control circuit, or port control circuit, 26 includes an ecoder, decoder and a counter and counts the clock CK fed thereto in synchronsim with the serial dat Din. As the write control circuit 26 counts a predetermined number, M, of clock CK, it generates a control signal or switch drive signal PW for turning on all the second switches 14-1 to 14-M at the same time.

Figure 2:
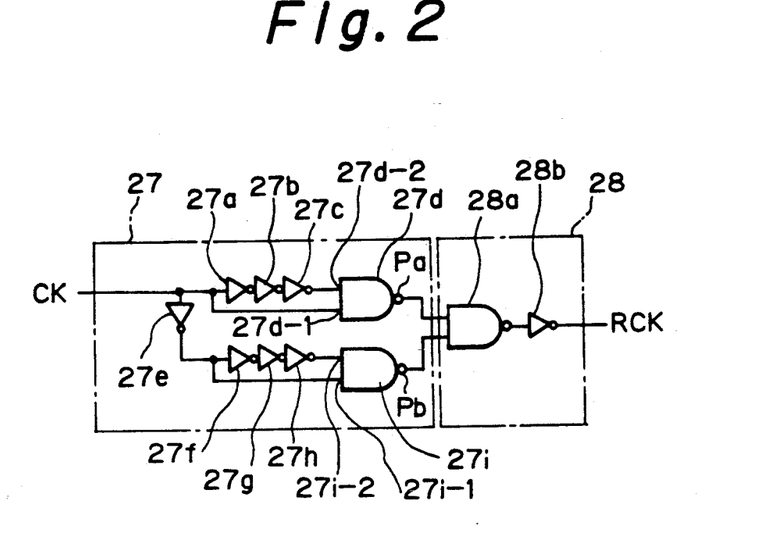
FIG. 2 is a circuit diagram showing a specific construction of part of the embodiment.
Figure 3:
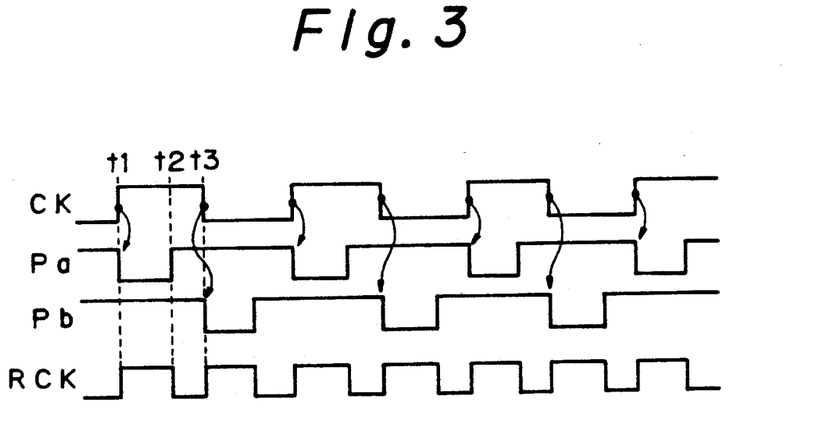
FIG. 3 is a timing chart representative of a specific operation of the embodiment.

The clock CK from the outside is also fed to the edge detecting circuit, or pulse detecting circuit 27. The edge detecting circuit 27 detects the positive-going and negative-going edges of the clock pulses CK while outputting edge signals representative of such edges. As shown in FIG. 2 specifically, the edge detecting circuit 27 is made up of a plurality of inverters 27a-27c, 27e and 27f-27h, and two NAND gates 27d and 27i. The inverters 27a-27c are connected to one input terminal 27d-2 of the NAND gate 27d and deliver the clock CK to the latter after delaying it a predetermined period of time and inverting it. The clock CK is directly fed to the other input terminal 27d-1 of the NAND gate 27d. In response, the NAND gate 27d NANDs the delayed and inverted clock from the inverters 27a-27c and the original clock CK and produces the result on an output terminal Pa. As shown in FIG. 3, the NAND output Pa goes low at each positive-going edge of the clock CK and returns on the elapse of the delay time ascribable to the inverters 27a-27c. The inverter 27e is positioned on a branch line connected to the other NAND gate 27e and inverts the clock CK. The inverters 27f-27h are connected to the other NAND gate 27i and delay the clock CK having been inverted by the inverter 27e a predetermined period of time while inverting it, delivering the resulting clock CK to one input terminal 27i-2 of the NAND gate 27i. At the same time, the clock CK inverted by the inverter 27i is routed to the other input terminal 27i-1 of the NAND gate 27i, bypassing the inverters 27f-27h. The NAND gate 27i NANDs the two input clocks CK and produces the result on an output terminal Pb thereof. As shown in FIG. 3, the NAND output Pb is an edge signal which goes low at each negative-going edge of the clock CK and restored on the elapse of the delay time determined by the inverters 27f-27h.

Receiving the two edges signals Pa and Pb from the edge detecting circuit 27, the clock doubling circuit 28 outputs the read clock RCK whose rate is twice as high as the rate of the input clock CK. As also shown in FIG. 2 specifically, the clock doubling circuit 28 has a NAND gate 28a and an inverter 28b. The NAND gate 28a NANDs the outputs Pa and Pb of the edge detecting circuit 27 while the inverter 28b inverts the NAND from the NAND gate 28a to produce the read clock RCK. As shown in FIG. 3, the read clock RCK goes high and remains in a high level at each of positive-going and negative-going edges of the clock CK. The read clock RCK is fed to the control register 24 of the output port block 25 and the read control circuit 29.

The read control circuit 29, like the write control circuit 26, has an encoder, decoder and a counter and controls the output port block 25 in response to the read clock RCK from the clock doubling circuit 28. The read control circuit 29 feeds the control signal PR to the third switches 20-1 to 20-M of the output port block 25 in response to the read clock RCK, whereby the data are read out of the main storage 13. Also, the read control circuit 29 drives the data bus 23 so as to feed out the data transferred to the data bus 23 serially as output data Dout.

How the embodiment controls the clock speed doubling procedure will be described under the heads of (A) Writing Operation and (B) Reading Operation hereinafter.

(A) WRITING OPERATION

The serial access memory 30 receives data Din serially and the clock CK in synchronism with the data Din. Then, the write control circuit 26 drives the data transfer line 17 to transfer the data Din serially thereto in synchronism with the clock CK. At the same time, in response to the clock CK, the control register 18 of the input port block 19 sequentially shifts "H" level data stored in, for example, the memory element 18-1 by a reset signal to the memory element 18-2 and successive memory elements 18-3 to 18-M. Therefore, as the first bit of the serial data is fed to the data transfer line 17, a drive signal is fed from the first memory element 18-1 to the first switch 16-1 to turn it on. As a result, data transfer line 17 is connected to the first memory element 15-1 of the data register 15, whereby the first bit of the serial data is written to the memory element 15-1. Subsequently, the second bit of the serial data is fed to the data transfer line 17, and the clock CK is applied to the line 17 in synchronism with the second bit. In response, the content of the memory element 18-1 of the control register 18 is sifted to the next memory element 18-2 to change it to "H". As a result, the switch 16-2 immediately following the switch 16-1 is turned on to write the second bit to the memory element 15-2 of the data register 15. Such a procedure is repeated until M serial data on the data bus 17 have been written to all of the memory elements 15-1 to 15-M of the data register 15. The write control circuit 26 counts the clock CK sequentially applied thereto from the outside. As soon as the write control circuit 26 counts M clock pulses CK, meaning that data have been written to all the memory elements 15-1 to 15-M of the data register 15, the circuit 26 sends a control signal PW to all of the second switches 14-1 to 14-M at the same time. Consequently, the switches 14-1 to 14-M are turned on at the same time to connect the data register 15 to the main storage 13, so that the data stored in the memory elements 15-1 to 15-M of the data register 15 are fed out to the bit lines 11-1 to 11-M, respectively. At this instant, the row decoder 12 selects one of the word lines 12-1 to 12-M. Assuming that the row decoder 12 has selected the word line 12-2 by way of example, then the data from the memory elements 15-1 to 15-M of the data register 15 are written to the memory elements 13-1 on the second column of the main storage 13 in parallel.

The next storing of M serial data are written to the main storage 13 in the same manner as the first M serial data. Specifically, the control register 18 is sequentially driven to in turn sequentially turn on the first switches 16-1 to 16-M with the result that M serial data are sequentially written to the memory elements 15-1 to 15-M of the data register 15. On receiving a control signal PW from the write control circuit 26, all the second switches 14-1 to 14-M are turned on at the same time to connect the data register 15 to the main storage 13. Then, the M data are transferred from the data register 15 to the main storage 13 via the bit lines 11-1 to 11-M. As the row decoder 12 selects, for example, the word line 12-3, the data from the data register 15 are written to an array of elements 13-1 on the third column of the main storage 13 in parallel. In this manner, the data Din serially arriving at the memory 30 are converted to parallel data every M bits and written to any unoccupied column of the main storage 13.

(B) READING OPERATION

The clock CK is also fed to the edge detecting circuit 27. As shown in FIG. 3, the edge detecting circuit 27 detects a positive-going edge of the clock CK at a time t1 and delivers an edge signal Pa indicative of such an edge to the clock doubling circuit 28. On detecting a negative-going edge of the clock CK at a time t3, the edge detecting circuit 27 feeds an edge signal Pb to the clock doubling circuit 28. The edge detecting circuit 27 repeats this operation in response to every pulse of the clock CK. As a result, the clock doubling circuit 28 generates the read clock RCK whose frequency is twice as high as the frequency of the clock CK in synchronism with the clock CK, as also shown in FIG. 3. The read clock RCK is delivered to the read control circuit 29 as a control clock and to the control register 24 of the output port block 25 as a control signal, thereby setting up synchronization for the read-out of data, as follows.

Assume that the row decoder 12 selects, for example, the word line 12-1 of the main storage 13 to read data out of the elements 13-1 on the first column. The third switches 20-1 to 20-M of the output port block 25 are turned on at the same time by a control signal PR fed from the read control circuit 29, connecting the output lines 10-1 to 10-M of the main storage 13 to the memory elements 21-1 to 21-M of the data register 21, respectively. As a result, data stored in the memory elements 13-1 on the first row of the main storage 13 are transferred to the corresponding memory elements 21-1 to 21-M of the data register 21 in parallel. On the completion of such data transfer, the read control circuit 29 stops sending the control signal PR to the switches 20-1 to 20-M to thereby turn them off. In this condition, the control register 24 sequentially turns on the fourth switches 22-1 to 22-M in response to double-speed clock synchronous to the read clock RCK with the result that the data stored in the memory elements 21-1 to 21-M of the data register 21 are fed out to the data bus 23 in series. At this instant, the data bus 23 is driven by the read control circuit 29. Hence, the data on the data bus 23 are serially fed out as output data Dout by way of the read control circuit 29. It is noteworthy that the control register 24 of the output port block 25 and the read control circuit 29 are each driven at a twice higher frequency than the clock CK and in synchronism with the clock CK, i.e., the output data Dout on the data bus 23 are fed out in synchronism with and at a twice higher speed than the data inputted to the chip 30. The procedure described above is repeated with all the data stored in the other columns of the main storage 13.

As stated above, the serial access memory 30 generates a read clock RCK having a rate double the rate of the clock CK within the chip and uses it as a control clock for the read control circuit 29. Therefore, the operation speed of the output port block 25 can be effectively controlled in synchronism with the operation of the input port block 19 and at a twice higher speed than the latter. Since the double-speed clock RCK is generated within the semiconductor chip 30, circuitry surrounding the chip can be simplified. It follows that the embodiment reduces the size and cost of an apparatus in which the semiconductor chip 30 is built, compared to the conventional system which generates such a clock outside the semiconductor chip 30.

Figure 4:
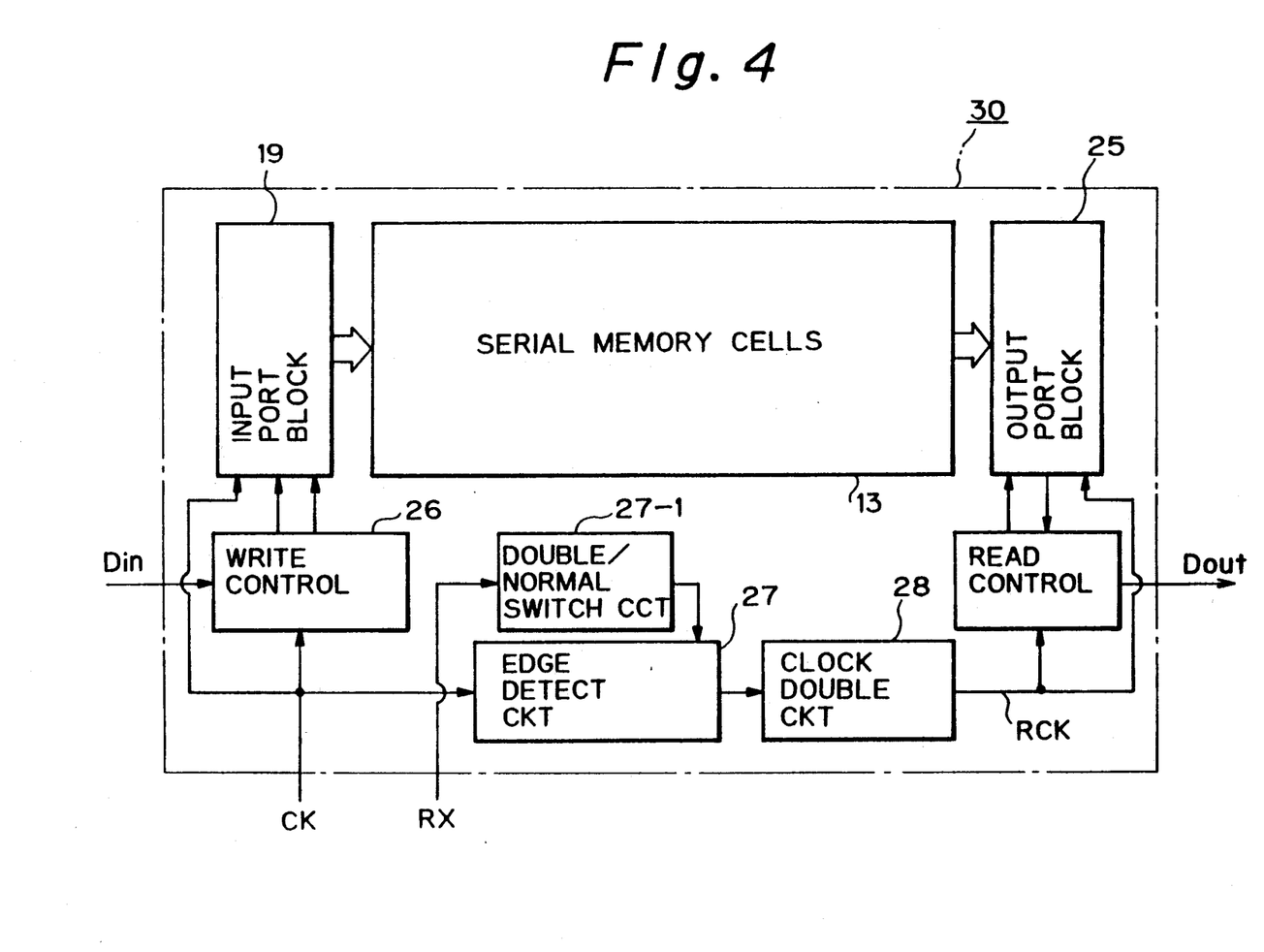
FIG. 4 is a schematic block diagram showing an alternative embodiment of the present invention.
Figure 5:
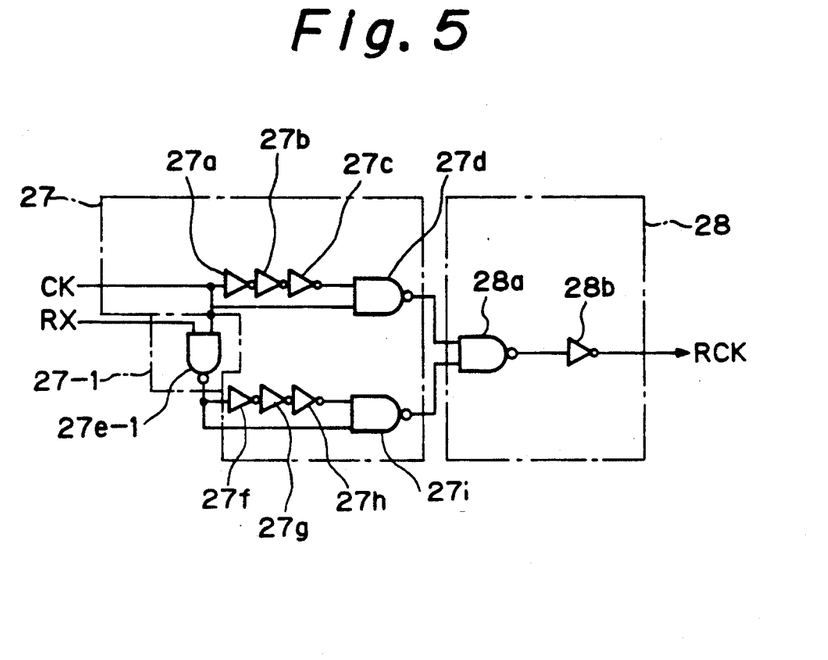
FIG. 5 is a circuit diagram showing a specific construction of part of the embodiment depicted in FIG. 4.
Figure 6:
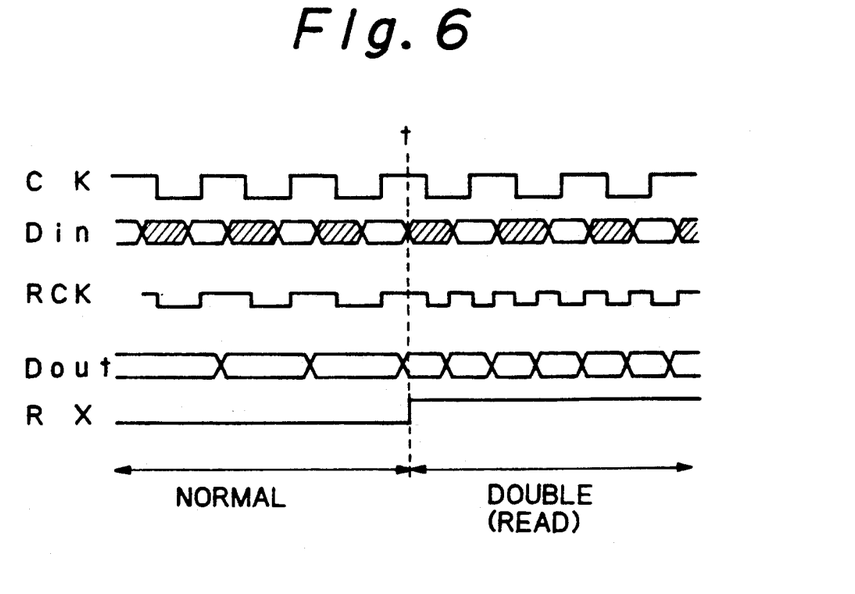
FIG. 6 is a timing chart representative of a specific operation of the embodiment shown in FIG. 4.

Referring to FIGS. 4-6, an alternative embodiment of the present invention will be described. In the figures, the same circuit components as those of the above-stated embodiment are designated by like reference numerals, and redundant description will be avoided for simplicity. As shown in FIG. 4, this embodiment differs from the previous embodiment in that a double/normal switching circuit 27-1 is connected to the edge detecting circuit 27 for selecting either of the double and normal clock speeds. As shown in FIG. 5 specifically, the double/normal switching circuit 27-1 includes a 2-input NAND gate 27e-1 in place of the inverter 27e included in the edge detecting circuit 27 of the previous embodiment. The NAND gate 27e-1 receives the clock CK at one input terminal thereof and receives a switching signal RX from the outside at the other input terminal. As shown in FIG. 6 specifically, the switching signal RX is continuously held in either of a high level and a low level. When the switching signal RX is in a high level, the NAND gate 27e-1 feeds an inverted clock of the clock CK to the edge detecting circuit 27. In this condition, the circuitry following the edge detecting circuit 27 doubles the clock rate as in the previous embodiment. On the other hand, when the switching signal RX is in a low level, the double/normal switching circuit 27-1 feeds a high level output to the edge detecting circuit 27. Then, the output of the second NAND gate 27i of the circuit 27 goes high to cause the following circuiry to operate with the normal clock having the same frequency as the clock CK.

As shown in FIG. 6, assume that the switching signal RX remains in a low level until a time t. In this condition, the clock doubling circuit 28 outputs a read clock RCK of the same frequency as the clock CK applied to the memory 30 from the outside, whereby data are read out of the main storage 13 at the same rate as the clock CK. As the switching signal RX goes high at the time t, the NAND gate 27e-1 of the double/normal switching circuit 27-1 is enabled. Then, the clock doubling circuit 28 is operated in the same manner as in the previous embodiment, producing a read clock RCK at a twice higher rate than the clock CK. As a result, data are read out of the main storage 13 at a rate double the rate of the clock CK. In this manner, the read clock RCK is selectively generated at the same rate as or double the rate of the clock CK in interlocked relation to the clock CK and in association with the level of the switching signal RX. The embodiment, therefore, effectively controls the read-out speed of the serial access memory by selecting either of the double speed and normal speed, as instructed by the switching signal RX which is applied to the memory from the outside.

Figure 7:
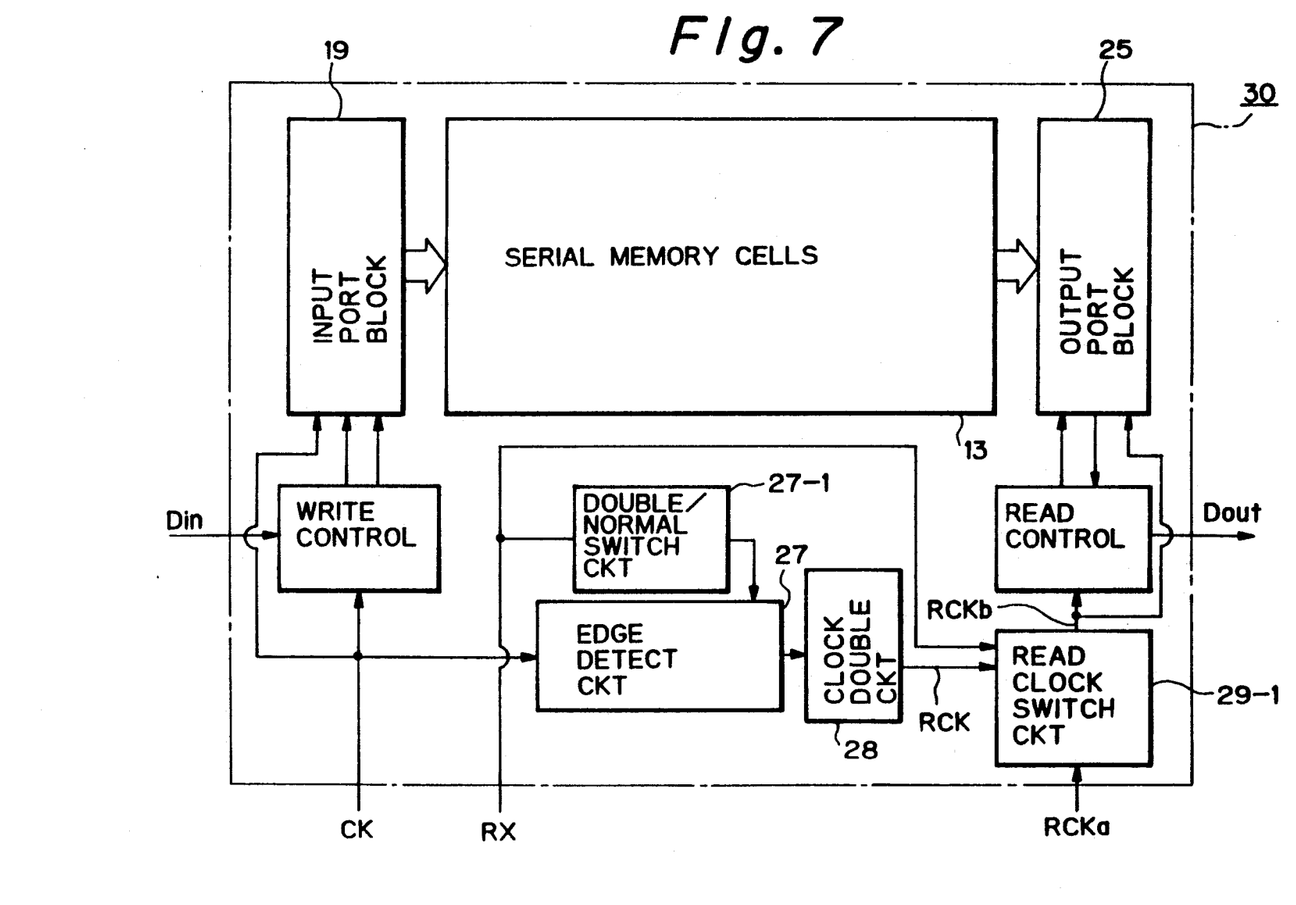
FIG. 7 is a schematic block diagram showing another alternative embodiment of the present invention.
Figure 8:
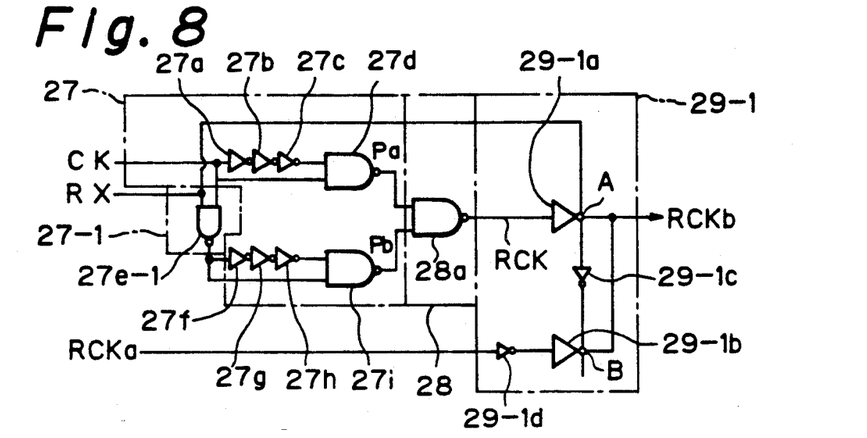
FIG. 8 is a circuit diagram showing a specific construction of part of the embodiment of FIG. 7.

A reference will be made to FIGS. 7 and 8 for describing another alternative embodiment of the present invention. In the figures, the same circuit components are designated by like reference numerals, and redundant description will be avoided for simplicity. Briefly, this embodiment is capable of reading out data in response to a read clock RCKa generated at the outside of the chip, in addition to the the double-speed clock RCK generated within the chip. Specifically, as shown in FIG. 8, the serial access memory 30 includes a read clock switching circuit 29-1 in addition to the circuits constituting the memory 30 shown in FIG. 4. The read clock switching circuit 29-1 selects either of the read clock RCKa applied to the memory 30 from the outside and the output of the clock doubling circuit 28 and delivers it to the read control circuit 29 as a read clock RCKb.

As shown in FIG. 8 specifically, the read clock switching circuit 29-1 is made up of tristate inverters 29-1a and 29-1b, and inverters 29-1c and 29-1d. The tristate inverters 29-1a and 29-1b have output control terminals A and B, respectively, so as to be controllable as to whether or not to produce an output. The inverter 29-1a receives the output of the clock doubling circuit 28 at the input thereof and receives a signal identical with the switching signal RX fed the double/normal switching circuit 27-1 at the output control terminal A. When the switching signal RX is in a high level, the output of the inverter 29-1a is opened to invert the clock from the clock doubling circuit 28 and output the inverted clock. As the switching signal RX goes low, the output of the inverter 29-1a is closed and, therefore, the inverter 29-1a does not produce an output. The other tristate inverter 29-1b receives the read clock RCKa via the inverter 29-1d and receives the switching signal RX at the output control terminal B via the inverter 29-1c. When the switching signal RX is in a high level, the output of the inverter 29-1b is closed. As the switching signal RX goes low, the output of the inverter 29-1b is opened with the result that the read clock RCKa inverted by the inverter 29-1d is again inverted and then applied to the read control circuit 29.

In the above construction, when the switching signal RX is in a high level, the tristable inverter 29-1a of the read clock circuit 29-1 connected to the clock doubling circuit 28 is open while the tristate inverter 29-1b connected to the external read clock RCKa is closed. In this condition, the read clock RCK from the clock doubling circuit 28 and generated within the chip 30 is selected to allow the circuitry to operate in the same manner as in the embodiment of FIG. 4. At this instant, since the switching signal RX is in a high level, the edge detecting circuit 27 is conditioned for the double speed by the double/normal switching circuit 27-1 As a result, the read clock switching circuit 29-1 produces the output RCK of the clock doubling circuit 28, which is twice as high as the rate of the clock CK, as a read clock RCKb in synchronism with the clock CK. When the switching signal goes low, the tristate inverter 29-1a is closed while the tristate inverter 29-1b is opened. Consequently, the read clock switching circuit 29-1 selects the external read clock RCKa and produces an output RCKb synchronous to the selected read clock RCKa.

As stated above, this embodiment is desirably adaptable to the circumstances of external circuitry since it can select the conventional clock speed doubling system by causing the switching signal to go low and, in addition, can make the external read clock RCKa asynchrnous to the external clock CK.

Figure 9:
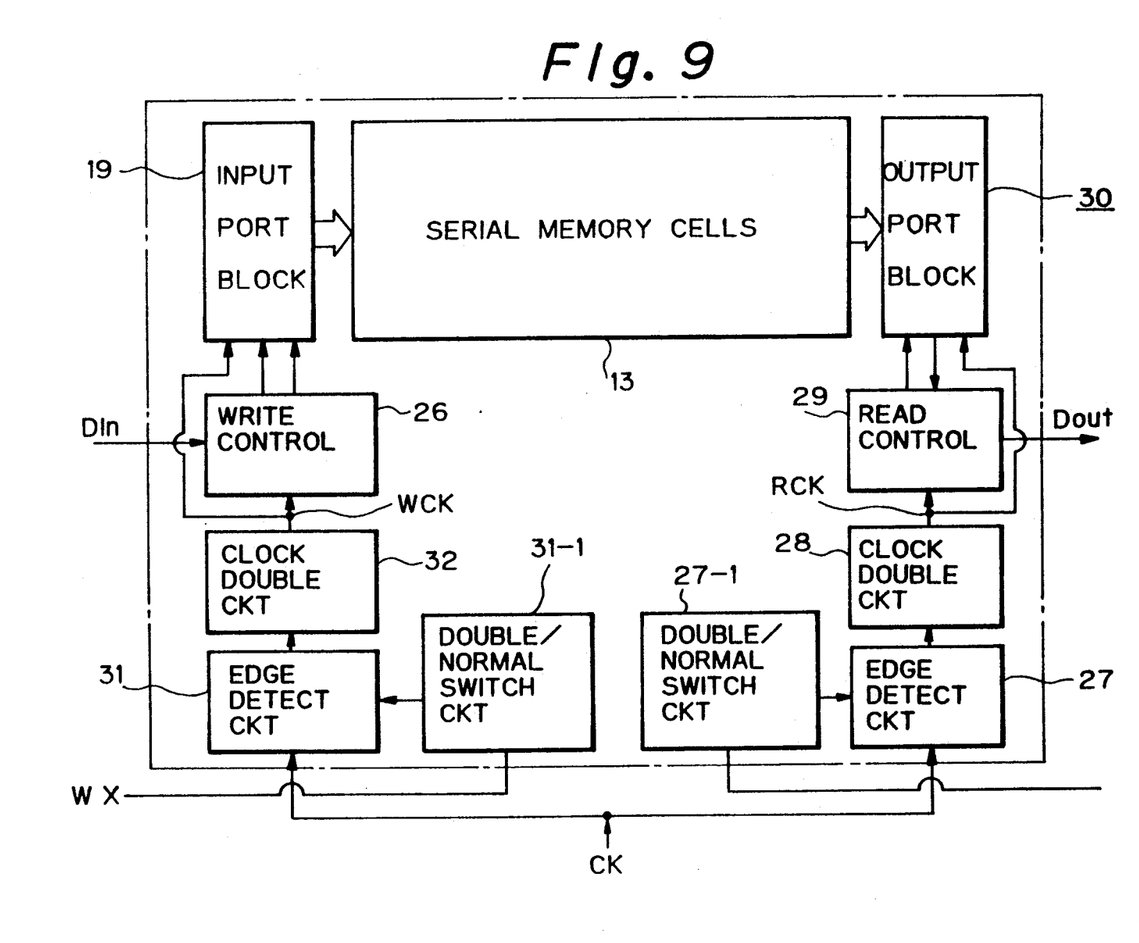
FIG. 9 is a block diagram schematically showing a further alternative embodiment of the present invention.
Figure 10:
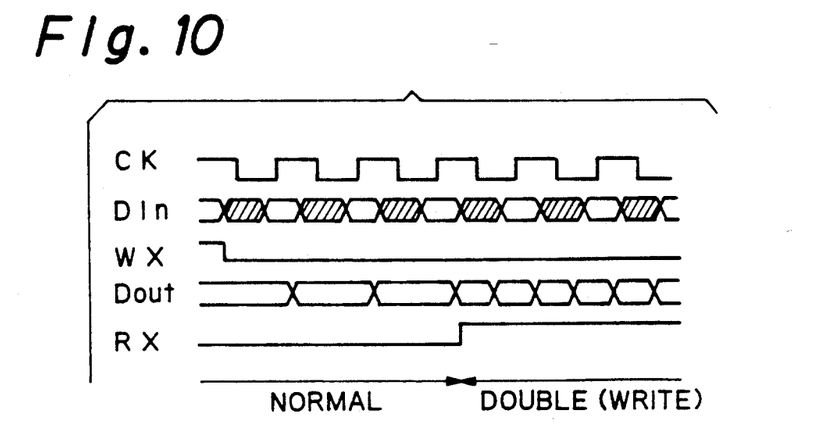
FIG. 10 is a timing chart demonstrating a specific operation of the embodiment shown in FIG. 9.

Referring to FIG. 9 and 10, a further alternative embodiment of the present invention is shown. In the figures, the same circuit components are designated by like reference numerals, and redundant description will be avoided for simplicity. As shown, the embodiment, like the embodiment of FIG. 4 has the edge detecting circuit 27, clock doubling circuit 28 and double/normal switching circuit 27-1 which are associated with the read control circuit 29. In addition, this embodiment has an edge detecting circuit 31, a clock doubling circuit 32, and a double/normal switching circuit 31-1 in association with the write control circuit 26. The edge detecting circuit 31 detects the positive going and negative-going edges of the external clock CK. In response to the result of detection by the detecting circuit 31, the clock doubling circuit 32 generates a write clock WCK synchronous to the clock CK at the same or double the frequency of the latter. The double/normal switching circuit 31-1 switches the frequency of the write clock WCK to either of a frequency equal to the frequency of the clock CK and a frequency twice as high as the frequency of the latter, as instructed by a write speed switching signal WX also applied to the memory 30 from the outside. The edge detecting circuit 31, clock doubling circuit 32 and double/normal switching circuit 31-1 are constructed in the same manner as the edge detecting circuit 27, clock doubling circuit 28 and double/normal switching circuit 27-1, respectively.

As FIG. 10 indicates, the embodiment of FIG. 9 uses the single clock CK fed from the outside for both of writing and reading purposes and can double the writing speed and reading speed in response to the switching signals WX and RX, respectively. Basically, this embodiment operates in almost the same manner as the embodiment of FIG. 4. It follows that the embodiment of FIG. 9 is capable of dealing with serial data having various rates which may be inputted and outputted from the chip, further enhancing the applicability of the present invention.

Figure 11:
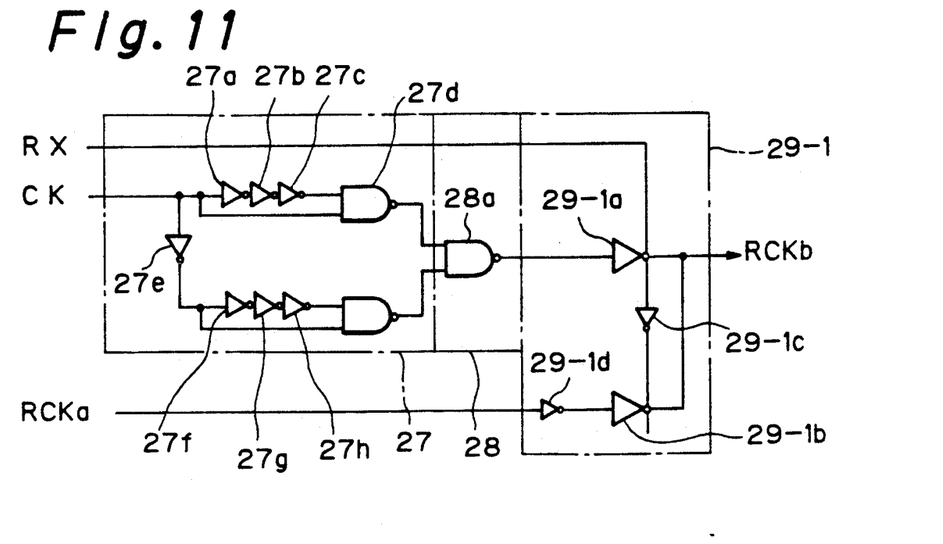
FIG. 11 is a circuit diagram showing another specific configuration of the embodiment of FIG. 7.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention. For example, while the embodiments shown in FIGS. 4, 7 and 9 each shows a single switching signal RX for switching the reading speed, the signal RX may be implemented as a combination of a plurality of signals to be applied to the semiconductor chip 30. The specific construction of the edge detecting circuit 27, clock doubling circuit 28 and double/normal switching circuit 27-1 shown in FIG. 8 may be replaced with a construction shown in FIG. 11. In FIG. 11, the 2-input NAND gate 27e-1 is replaced with an inverter 27-e while the switching signal RX for switching the reading speed is connected to the control terminal A of the tristate inverter 29-1a. This is successful in simplifying the circuitry. If desired, the main storage 13 may be constituted by an SRAM (Static Random Access Memory) in place of a DRAM shown and described.

What is claimed is:

1. A serial access memory capable of reading out data serially at a speed higher than a writing speed, comprising:

a memory circuit having an input and an output for sequentially storing data written thereinto and reading the data thereoutof;

a data inputting circuit connected to the input of said memory circuit for writing data serially inputted from the outside of said serial access memory into predetermined address locations of said memory circuit;

a write control circuit responsive to an external clock for controlling a writing operation to be performed by said data inputting circuit on the basis of said external clock;

a data outputting circuit connected to the output of said memory circuit for reading data out of said memory circuit and outputting said data in series;

an edge detecting circuit for detecting rising and falling edges of the external clock applied to said write control circuit;

a clock generating circuit for generating a first read clock having a frequency higher than the frequency of the external clock in response to a result of edge detection by said edge detecting circuit; and a read control circuit for controlling said data outputting circuit in response to the first read clock from said clock generating circuit.

2. A memory in accordance with claim 1, wherein said clock generating circuit generates the first read clock having a frequency double the frequency of the external clock.

3. A memory in accordance with claim 1, wherein said data inputting circuit writes serially inputted data into said memory circuit after converting a predetermined number of bits of the inputted data to parallel data at a time.

4. A memory in accordance with claim 3, wherein said data inputting circuit comprises:

a data bus for transferring data from the outside serially;

a data register for receiving the data from said data bus to store a predetermined number of bits of said data at a time;

a plurality of first switches for selectively connecting said data bus to said data register;

a control register for sequentially turning on said plurality of first switches in response to the external clock; and a plurality of second switches for selectively connecting said data register to the input of said memory circuit and being turned on or turned off at the same time under the control of said write control circuit.

5. A memory in accordance with claim 1, wherein said memory circuit comprises a dynamic random access memory circuit.

6. A memory in accordance with claim 1, wherein said memory circuit comprises a static random access memory circuit.

7. A memory in accordance with claim 1, wherein said memory circuit receives data from said data inputting circuit in parallel, writes the data in the memory locations on a designated column, and delivers the data on said designated column to said data outputting circuit in parallel.

8. A memory in accordance with claim 7, wherein said memory circuit comprises a decoder for designating a column address of said memory circuit in the event of writing and reading operations.

9. A memory in accordance with claim 1, wherein said data outputting circuit reads data out of said memory circuit in parallel and converts the read data to serial data.

10. A memory in accordance with claim 9, wherein said data outputting circuit comprises:

a data register for temporarily storing data read from said memory circuit in parallel;

a plurality of third switches for selectively connecting the output of said memory circuit to said data register in parallel and being turned on or off at the same time under the control of said read control circuit;

a data bus for transferring data from said data register in series;

a plurality of fourth switches for selectively connecting said data register to said data bus; and a control register for sequentially turning on or off said plurality of second switches in response to the read clock from said clock generating circuit.

11. A memory in accordance with claim 1, wherein said edge detecting circuit comprises:

a plurality of inverters;

a first NAND gate receiving the external clock and the delayed external clock which is the external clock inverted by said inverters to detect rising edges of the external clock and generating a rising edge detection signal; and a second NAND gate receiving the inverted external clock inverted by the inverter and the delayed inverted external clock which is the inverted external clock inverted by the other inverters to detect falling edges of the external clock and generating a falling edge detection signal.

12. A memory in accordance with claim 11, wherein said clock generating circuit generates the first read clock from the rising edge detection signal and the falling edge detection signal fed from said edge detecting circuit.

13. A memory in accordance with claim 1, further comprising a read clock changing circuit for changing the first read clock to either of a clock having the same frequency as the external clock and a clock having a frequency higher than the frequency of the external clock in response to a reading speed switching signal fed from the outside of said memory.

14. A memory in accordance with claim 13, wherein said read clock changing circuit comprises a NAND gate for receiving the reading speed switching signal and the external clock and allows said edge detecting circuit to detect falling edges only when the reading speed switching signal has a predetermined logical level.

15. A memory in accordance with claim 13, further comprising a read clock switching circuit responsive to said reading speed switching signal for selecting either of the read clock and a second read clock fed from the outside of said memory.

16. A memory in accordance with claim 15, wherein said read clock switching circuit comprises a first and a second tristate inverter each having an output control terminal for determining whether or not to produce an output, said first tristate inverter receiving the first read clock while the second tristate inverter receiving the second read clock, the output control terminals of said first and second inverters receiving the speed switching signal and the inverted speed switching signal, respectively.

17. A memory in accordance with claim 1, further comprising:

a write edge detecting circuit for detecting the rising and falling edges of the external clock;

a write clock generating circuit responsive to a result of detection by said write edge detecting circuit for generating a write clock having a frequency equal to or higher than the frequency of the external clock and feeding said write clock to said write control circuit; and a write clock switching circuit responsive to a writing speed switching signal fed from the outside of said memory for switching the write clock to either of the frequency equal to the frequency of the external clock and the frequency higher than the frequency of the external clock.

* * * * *